(12) United States Patent
Knoedgen et al.

(10) Patent No.: US 8,890,510 B2
(45) Date of Patent: Nov. 18, 2014

(54) BATTERY WAKE-UP

(75) Inventors: Horst Knoedgen, Munich (DE);
Francesco Marraccini, Munich (DE)

(73) Assignee: Dialog Semiconductor GmbH,
Kirchheim/Teck-Nabern (DE)

( * ) Notice: Subject to any disclaimer, the term of this patent is extended or adjusted under 35 U.S.C. 154(b) by 285 days.

(21) Appl. No.: 13/414,756

(22) Filed: Mar. 8, 2012

(65) Prior Publication Data

US 2013/0221947 A1   Aug. 29, 2013

(30) Foreign Application Priority Data

Feb. 28, 2012   (EP) ..................................... 12368005

(51) Int. Cl.
*G01R 19/00*   (2006.01)

(52) U.S. Cl.
USPC .... 324/123 R; 324/111; 324/113; 324/123 C; 324/433; 324/551; 324/750.01; 327/58; 327/94; 327/333; 327/341; 250/208.1

(58) Field of Classification Search
CPC ................... G01R 19/16552; G01R 19/16519; G06F 1/32; G06F 1/26
USPC ............. 324/123 R, 433, 750.01, 123 C, 111, 324/113, 551; 327/94, 58, 333, 341; 250/208.1
See application file for complete search history.

(56) References Cited

U.S. PATENT DOCUMENTS

| | | | | |
|---|---|---|---|---|
| 5,585,756 A | * | 12/1996 | Wang | 327/341 |
| 5,677,077 A | * | 10/1997 | Faulk | 429/90 |
| 6,762,636 B1 | * | 7/2004 | Khawshe | 327/175 |
| 6,866,639 B2 | | 3/2005 | Causevic et al. | |
| 7,142,838 B2 | | 11/2006 | Rotzoll | |
| 7,199,783 B2 | | 4/2007 | Wenstrand et al. | |
| 8,471,751 B2 | * | 6/2013 | Wang | 341/156 |
| 2002/0135402 A1 | * | 9/2002 | Miyabe et al. | 327/94 |
| 2003/0016027 A1 | * | 1/2003 | McMahon et al. | 324/600 |
| 2005/0069155 A1 | * | 3/2005 | Gagon | 381/120 |
| 2005/0151624 A1 | | 7/2005 | Qualich et al. | |
| 2008/0006764 A1 | * | 1/2008 | Boemler | 250/208.1 |
| 2008/0042695 A1 | * | 2/2008 | Yen et al. | 327/95 |
| 2008/0199190 A1 | * | 8/2008 | Hakomori et al. | 398/202 |
| 2009/0132188 A1 | * | 5/2009 | Watanabe | 702/64 |
| 2010/0069026 A1 | * | 3/2010 | Shute et al. | 455/127.3 |
| 2010/0237936 A1 | * | 9/2010 | Takeda | 330/98 |
| 2010/0308841 A1 | * | 12/2010 | Karrer et al. | 324/551 |
| 2011/0241732 A1 | | 10/2011 | Tourret | |
| 2012/0261994 A1 | * | 10/2012 | Nikolov et al. | 307/66 |
| 2013/0069706 A1 | * | 3/2013 | Ivanov | 327/333 |

OTHER PUBLICATIONS

European Search Report, Dialog Semiconductor GmbH, 12368005.0-2216, Mail date—Jul. 31, 2012.

* cited by examiner

*Primary Examiner* — Huy Q Phan
*Assistant Examiner* — David Frederiksen
(74) *Attorney, Agent, or Firm* — Saile Ackerman LLC; Stephen B. Ackerman

(57) ABSTRACT

Circuits and methods for fast detection of a low voltage in the range of few µVolts have been achieved. In a preferred embodiment the low voltage represents a current via a shunt resistor and the circuit is used to generate a digital wake-up signal. In regard of the wake-up application the circuit invented is activated periodically and in case of a certain level of the voltage drop, e.g. 50 µV, at the shunt resistor. The time required for a measurement of the voltage drop is inclusive calibration and integration time far below 1 ms. It is obvious that the circuit invented can be used for any measurements of very small voltages.

19 Claims, 5 Drawing Sheets

BATTERY WAKE-UP

BACKGROUND

(1) Technical Field

This disclosure relates generally to circuits and methods to detect signals in the μVolts range and relates more specifically to circuits being capable to rapidly detect short wake-up signals to activate a system.

(2) Background

Reducing power consumption of battery-operated devices is a significant challenge for engineers designing such systems. The functional range of modern electronic mobile devices is increasing rapidly and hence the efficiency of the electronic circuits has to be improved accordingly to extend battery lifetime.

Wake-up signals should consume minimal power only. Therefore these signals should be in the range of μVolts and such small signals should be detected and converted to a digital signal with a minimum delay in the range of below 1 msec.

It is a challenge for engineers designing circuits capable of detecting such small signals and converting them to a digital signal with a minimum delay only.

SUMMARY

A principal object of the present disclosure is to achieve a circuit for fast detection of low voltage signals.

Another principal object of the disclosure is to fast process wake-up signals for a battery to reduce power consumption.

A further object of the disclosure is to minimize 1/f noise by special sampling technique A further object of the disclosure is to achieve a very low temperature drift of the circuit.

A further object of the disclosure is to achieve a very low voltage offset in respect of the input signal.

A further object of the disclosure is to cancel charge injection and switching noise.

In accordance with the objects of this disclosure a method to fast detect a low voltage in the range of few μVolts has been achieved. The method comprising, firstly, the following steps: (1) providing a circuit comprising input ports for a voltage to be measured, an output port, a pre-amplifier, a buffer amplifier, an arrangement of switches used for calibration of the circuit, an integrator stage with reset function, and a voltage source for calibrating the integrator stage, (2) calibrating the pre-amplifier before each measurement of the voltage is performed, (3) start calibration of the integrator stage by providing a voltage stimulus from said voltage source to the integrator stage, and (4) storing the integrated output signal of the integrator stage generated from said calibration voltage measurement. Furthermore the method comprises the steps of: (5) setting said switches to perform the voltage measurement, (6) storing the integrated output signal of the integrator stage generated from said voltage measurement, and (7) generating an output signal of the circuit if a difference between the calibration signal and the measurement signal exceeds a defined level, wherein all errors of the circuit are eliminated by said differentially generated signal.

In accordance with the objects of this disclosure a circuit for fast detection of a low voltage in the range of few μVolts has been achieved. The circuit invented comprises, firstly: a shunt resistor, wherein an input current generates a voltage drop, a pre-amplifier stage, wherein a first input is connected to a second terminal of a first switching means and a second input is connected to a second terminal of the shunt resistor, said first switching means, wherein a first terminal of the switching means is connected to a first terminal of the shunt resistor, and a second switching means being connected between both inputs of the pre-amplifier, wherein a first terminal of the switching means is connected to a first terminal of the shunt resistor.

Furthermore the circuit comprises: a first capacitor, wherein a first terminal is connected to the output of the preamplifier and a second terminal is connected to a first input of a buffer amplifier and to a first terminal of a third switching means, said third switching means, wherein a second terminal is connected to a positive terminal of a first voltage source, said first voltage source, having a positive and a negative terminal, wherein a negative terminal is connected to ground, and said buffer amplifier, having two inputs and an output, wherein a second input is connected to the output, and the output is further connected to an input of an integrator stage. Moreover the circuit comprises said integrator stage comprising: an input resistor connected between the output of the buffer amplifier and a first input of an operational amplifier, said operational amplifier having two inputs and an output, wherein a second input is connected to the positive terminal of the first voltage source and the output is connected to an input of a sample and hold stage, to a second terminal of a feedback capacitor and to a second terminal of a reset switching means, said feedback capacitor wherein a first terminal of the feedback capacitor is connected to the first input of the operational amplifier, and said reset switching means wherein a first terminal of the reset switching means is connected to the first input of the operational amplifier. Finally the circuit comprises said sample and hold stage generating a digital output signal of the circuit.

BRIEF DESCRIPTION OF THE DRAWINGS

In the accompanying drawings forming a material part of this description, there is shown.

DESCRIPTION OF THE PREFERRED EMBODIMENTS

Methods and circuits for the detection and measurement of low voltage signals are disclosed. The circuits disclosed can be applied to a broad variety of measurements. It should be understood that the circuit and method disclosed could be applied for all kind of voltage measurements in the range of μVolts.

Figure 1:
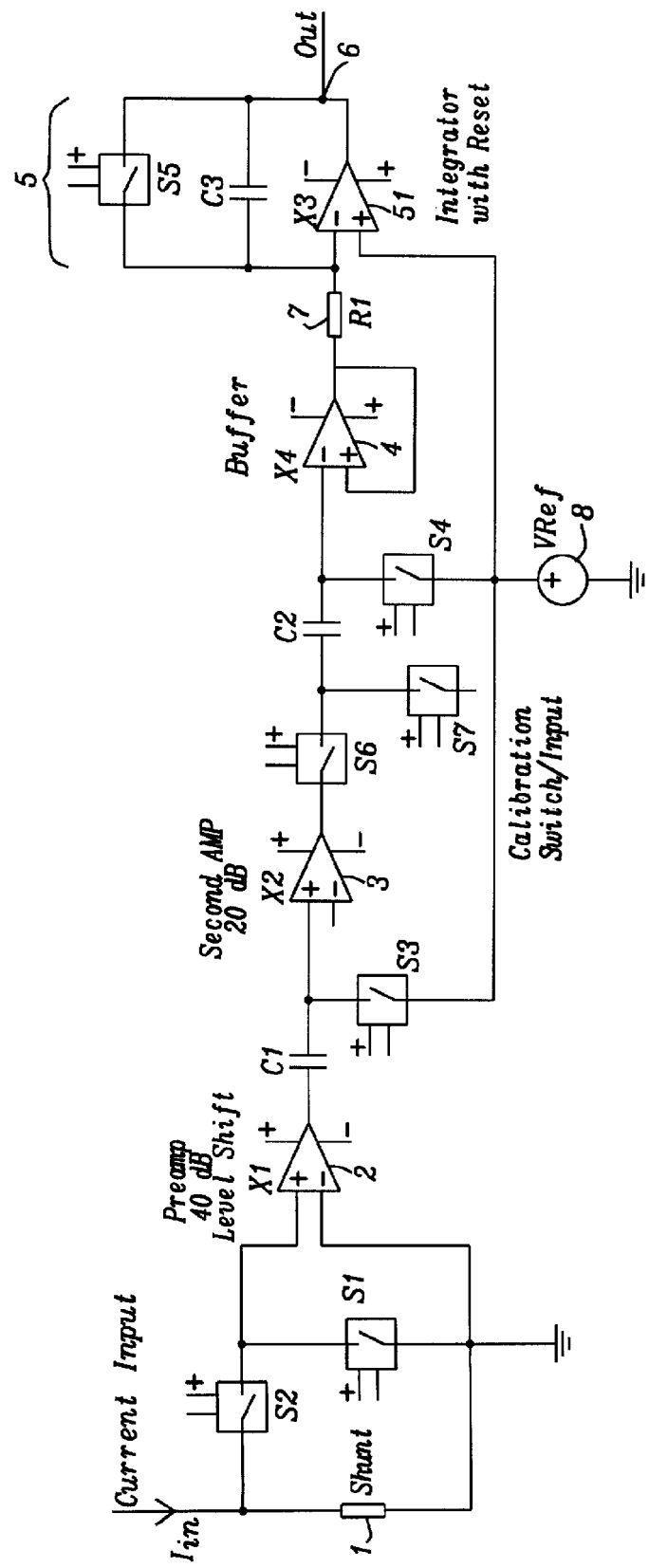
FIG. 1 shows a basic block diagram of a first embodiment of a signal detection circuit invented.

FIG. 1 shows a basic block diagram of a first preferred embodiment of the signal detection circuit invented.

The circuit is to detect a voltage drop in the order of magnitude of e.g. 50 μV as across the shunt resistance 1. Dealing with very small voltage drops of e.g. 50 μV frequency band limitation, avoiding 1/f noise, and offset canceling is absolutely required.

The circuit comprises an arrangement of switches S1-S7 used for calibration and operation of the circuit. Main components of the circuit are a pre-amplifier stage 2, a second amplifier 3, an AC coupling C1 canceling an offset between the pre-amplifier stage 2 and the second amplifier 3, a buffer amplifier 4, and via an input resistor 7 an integrator stage 5 including a reset function.

By using an AC coupled system, the second input of the amplifier 3 can be connected to any potential. This is also possible if the system is constructed differential.

The integrator stage 5 comprises an operational amplifier 51 wherein its first input is connected via input resistor 7 to the output of the buffer amplifier 4 and its second input is connected to the positive terminal of the voltage source Vref 8. Furthermore a feedback capacitor C3 and in parallel a reset switch S5 are connected between input and output of the operational amplifier 51. This means that the difference between both inputs of the operational amplifier 51 gets integrated.

The pre-amplifier stage 2 is a combination of a level shifter circuit and a first gain stage. The first gain stage is provided with a high gain; hence the noise of the first gain stage will be dominant. The AC coupling C1 eliminates the offset of the first stage.

Generally, the gain depends upon the application. The gain should at least be so high, that the input noise of the next stage can be neglected. The gain of a preferred embodiment is in a range of about 20 to 40 dB.

The system has to be calibrated before the signal detection takes place. In order to perform amplifier calibration switch S1 is closed and with a certain delay switches S3 and S4 are opened, i.e. as soon the preamplifier 2 and the second amplifier 3 are settled. Switches S3 and S4 will short the capacitors C1 and C2 to the reference voltage 8 and after opening of the switches S3 and S4, the time constant of the high pass filter will be extremely high, i.e. the cut-off frequency will be very low, (leakage depending), removing the switching noise of the capacitor. The high pass filter will have after reset an extreme high time constant, because there is no timing resistor to ground.

Switches S6 and S7 are used only for the calibration of the integrator stage 5. Switch S6 is opened and switch S7 is closed to generate a voltage stimulus for the integrator calibration. The integrator stage 5 receives this voltage stimulus via switch S7 and a correspondent signal is measured at the output port 6 of the circuit. By this integrator calibration the gain of the integrator is known and the temperature coefficient of the input resistor R1 of the integrator 5 stage can be easily eliminated. S7 is an auxiliary input for calibration. In some cases the gain of the integrator is important and by using switch S7 the gain of the amplifier can be calibrated. Switch S5 is used to reset the integrator stage 5.

After the stabilization of the amplifiers, the integrator will release the reset and it will start to be ready for operation. The time required for stabilization is in a range below 50 µs. The integration time for the integrator calibration should be in the same order of magnitude as for the measurement of the voltage drop at the shunt resistor 1. In order to minimize the 1/f noise, the time of the total integration, i.e. required for calibration and measurement should be about 100 to 200 µs. The total time span required between calibration of the circuit and generation of an output signal is far below 1 msec After the calibration phase, switch S1 will be opened and switch S2 will be closed. The signal difference at the output port 6 between the signal obtained during the integrator calibration and the signal obtained after the measurement integrations generates the wake up trigger signal. The integrator defines the bandwidth limitation of the system.

An important feature of the disclosure is that both calibration signal and measurement signal uses the same circuit conditions with a very short time delay and all the errors (offset, charge injection, etc.) will be the same at least until the signal will be amplified.

It should be noted that alternatively the second amplifier 3 with all support elements could be omitted if the gain of the first gain stage is high enough and the gain of the second amplifier 3 is not required. In this case the offset canceling C1 can be also omitted.

Figure 4:
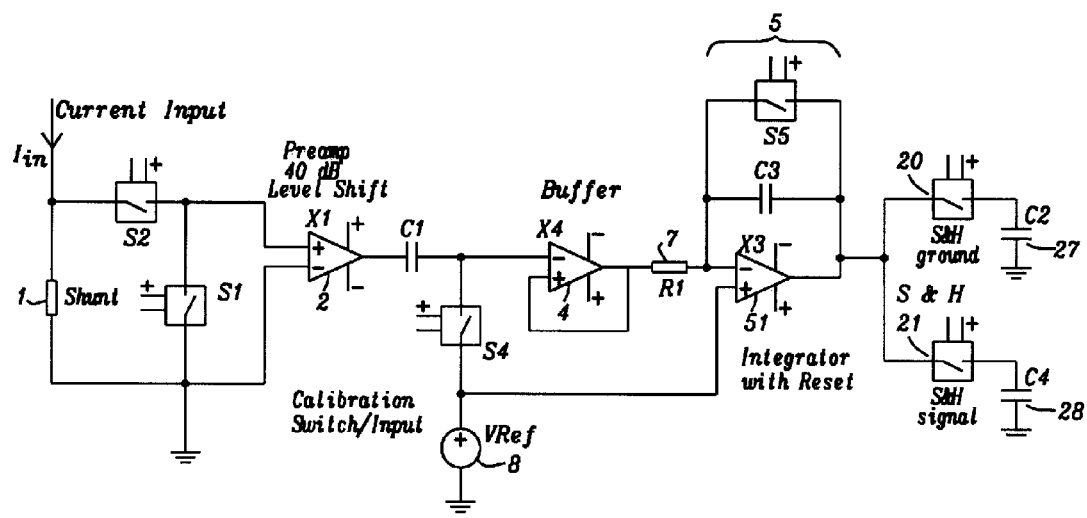
FIG. 4 shows a basic block diagram of a second embodiment of a circuit without a second amplifier and correspondent support elements.

FIG. 4 shows a basic block diagram of a second embodiment of a circuit without a second amplifier 3 and correspondent support elements. Same numerals have been used for like components of the circuit. Compared to the circuit shown in FIG. 1 switches S3, S6, S7 and capacitor C2 can be omitted in the circuit of FIG. 4.

Figure 2:
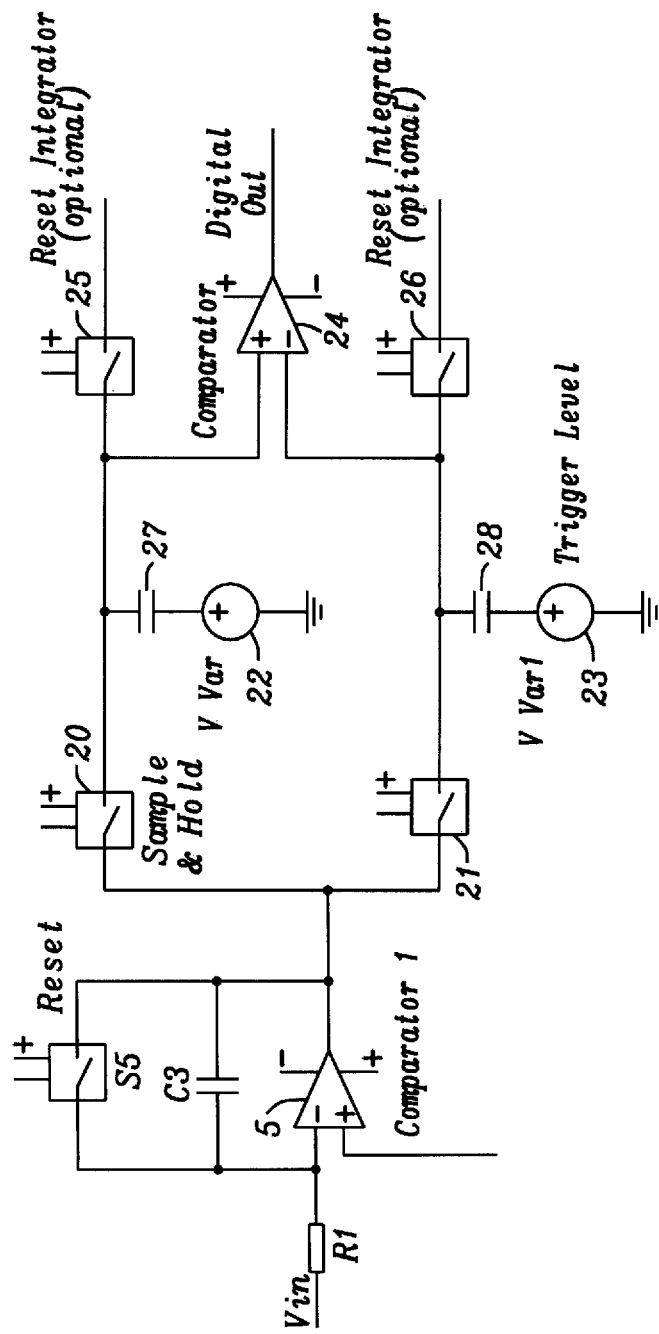
FIG. 2 shows a basic block diagram of the integrator stage together with the following trigger signal detection.

FIG. 2 shows a basic block diagram of the integrator stage together with following trigger signal detection.

FIG. 2 illustrates, as shown in FIG. 1, the integrator stage 5, two sample and hold switches 20 and 21, two capacitors 27 and 28, two voltage sources "V_var" 22 and 23, switches and a comparator 24 generating a digital output signal. FIG. 2 also shows optional integrator switches 25 and 26.

The calibration signal will be sampled when switch 20 is closed and switch 21 is open. The measurement signal will be sampled when switch 21 is closed and switch 20 is open. A trigger level is defined by the two voltage sources 22 and 23 having an identical voltage level, wherein the trigger of the comparator 24 is stimulated the trigger level of these voltage sources.

The comparator 24 can be used as an analog-to-digital converter (ADC), if the voltage sources (23/24) are modulated. The comparator 24 can also used as a simple voltage trigger with a defined system gain.

Alternatively a full differential measurement, i.e. between end of calibration and measurement signal could be performed. The difference between both signals corresponds to the system input signal, i.e. the voltage drop at the shunt resistor.

In a preferred embodiment of the disclosure the circuit is used periodically, e.g. every second, and the input current, represented by the voltage drop at the shunt resistor, is measured to activate a system outside the circuit invented by the digital output signal if a certain level of the voltage drop is exceeded.

The voltage drop across shunt resistor 1 may vary between 0 V (no current) and about several 10 mV. There is no hard limit. The circuit can be used as a trigger or to measure the signal analog.

Figure 5:
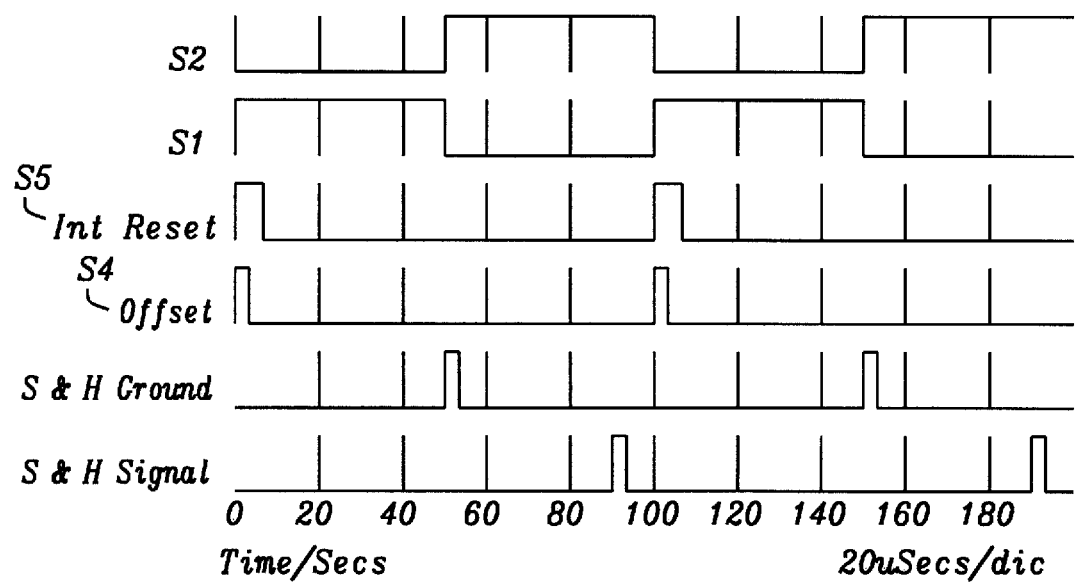
FIG. 5 depicts time charts of input signals at switches S1 and S2, of signals at internal reset switch, signals at offset switch S4, signals at sample & hold ground switch 20, and at sample & hold signal switch 21.

FIG. 5 depicts time charts of input signals at switches S1 and S2, of signals at internal reset switch S5, at offset switch S4, at sample & hold ground switch 20, and at sample & hold signal switch 21.

Figure 3:
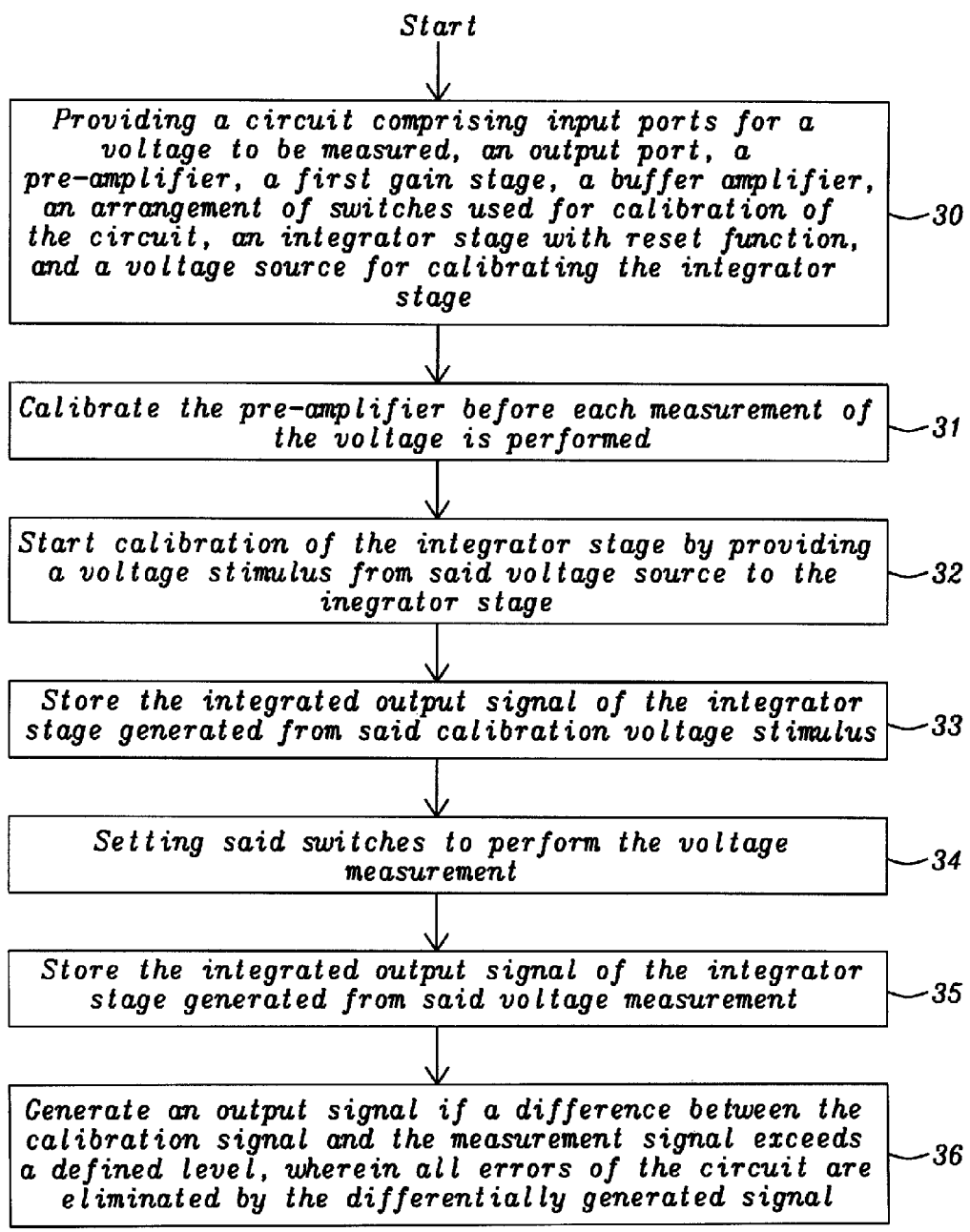
FIG. 3 illustrates a flowchart of a method invented to fast detect a low voltage even in the range of few μVolts.

FIG. 3 illustrates a flowchart of a method invented to fast detect a low voltage even in the range of few µVolts. Step 30 of the method of FIG. 3 illustrates the provision of a circuit comprising input ports for a voltage to be measured, an output port, a pre-amplifier, a buffer amplifier, an arrangement of switches used for calibration of the circuit, an integrator stage with reset function, and a voltage source for calibrating the integrator stage. Step 31 depicts calibrate the pre-amplifier before each measurement of the voltage is performed. Step 32 illustrates start calibration of the integrator stage by providing a voltage stimulus from said voltage source to the integrator stage. Step 33 illustrates storing the integrated output signal of the integrator stage generated from said calibration voltage measurement. Step 34 depicts setting said switches to perform the voltage measurement. Step 35 illustrates storing the integrated output signal of the integrator stage generated from said voltage measurement, and step 36 depicts generating an output signal of the circuit if a difference between the calibration signal and the measurement signal exceeds a defined level, wherein all errors of the circuit are eliminated by said differentially generated signal.

In summary key items of the disclosure are:

Fast detection of a very low voltage signal, e.g. 50 μV in far below 1 msec.

Minimizing 1/f noise by special sampling technique

Frequency band limitation by integration time

Very high duty cycle possible

Low current consumption of the circuit

Offset canceling

Variable gain by changing the integrator time

Very low noise at the input in respect of low switching frequency, and

Very high input impedance

While the disclosure has been particularly shown and described with reference to the preferred embodiments thereof, it will be understood by those skilled in the art that various changes in form and details may be made without departing from the spirit and scope of the disclosure.

What is claimed is:

1. A method to fast detect a low voltage in the range of few μVolts, comprising the following steps:
    (1) providing a circuit comprising input ports for a voltage to be measured, an output port, a pre-amplifier, a second amplifier, a buffer amplifier, an arrangement of switches used for calibration of the circuit, an integrator stage with reset function, and a voltage source for calibrating the integrator stage;
    (2) connecting an output of the pre-amplifier to an input of the second amplifier and an output of the second amplifier to an input of the buffer amplifier and an output of the buffer amplifier to an input of the integrator stage, wherein an output of the integrator stage is the output of the circuit,
    (3) calibrating the pre-amplifier before each measurement of the voltage is performed;
    (4) start calibration of the integrator stage by providing a voltage stimulus from said voltage source to the integrator stage;
    (5) storing the integrated output signal of the integrator stage generated from said calibration voltage measurement;
    (6) setting said switches to perform the voltage measurement;
    (7) storing the integrated output signal of the integrator stage generated from said voltage measurement; and
    (8) generating an output signal of the circuit if a difference between the calibration signal and the measurement signal exceeds a defined level, wherein all errors of the circuit are eliminated by said differentially generated signal.

2. The method of claim 1 wherein the pre-amplifier comprises a level shifter circuit and a first gain stage.

3. The method of claim 2 wherein the first gain stage is deployed with a high gain in order to have noise from the first gain stage being dominant in regard of the total circuit.

4. The method of claim 1 wherein said calibrating of the pre-amplifier is performed by shorting two input ports of the first gain stage.

5. The method of claim 1 wherein additionally a second amplifier is provided, wherein the output of the pre-amplifier is the input of the second amplifier and wherein an AC coupling by a first capacitor between the pre-amplifier and second amplifier eliminates an offset of the pre-amplifier.

6. The method of claim 5 wherein said first capacitor and a second capacitor deployed at the output of the second amplifier are shortened to said voltage source during calibration of the pre-amplifier only.

7. The method of claim 1 wherein the difference between the calibration signal and the measurement signal is controlled via a comparator.

8. The method of claim 1 wherein said storing of the integrated output signal of the integrator stage generated from the calibration voltage measurement is performed using a first sample and hold circuit and said storing of the integrated output signal of the integrator stage generated from the voltage measurement is performed using a second sample and hold circuit.

9. The method of claim 8 wherein a trigger level for the output signal of the circuit is defined by two voltage sources having an identical voltage level, wherein the trigger of the comparator is stimulated the trigger level of these voltage sources.

10. The method of claim 1 wherein the time span required between calibration of the circuit and generation of an output signal is far below 1 msec.

11. The method of claim 1 wherein the method is applied for a voltage trigger with a defined system gain.

12. A circuit for fast detection of a low voltage in the range of few μVolts, comprising:
    a shunt resistor configured to convert an input current to a voltage drop;
    a pre-amplifier stage, wherein a first input is connected to a second terminal of a first switching means and a second input is connected to a second terminal of the shunt resistor;
    said first switching means, wherein a first terminal of the switching means is connected to a first terminal of the shunt resistor;
    a second switching means being connected between both inputs of the pre-amplifier, wherein a first terminal of the switching means is connected to a first terminal of the shunt resistor;
    a first capacitor, wherein a first terminal is connected to the output of the preamplifier and a second terminal is connected to a first input of a second amplifier of a second amplifying stage and to a first terminal of a third switching means;
    said second amplifying stage comprising:
        said second amplifier having two inputs and an output, wherein the output is connected to a first terminal of a fifth switching means;
        said fifth switching means, configured to be used for calibration of the integrator stage only, having a second terminal connected a first terminal of a second capacitor and to a first terminal of a sixth switching means;
        said sixth switching means configured to be used for calibration of the integrator stage only;
        said second capacitor connected between a second terminal of the fifth switching means and a first input of a buffer amplifier; and
        said third switching means, wherein a second terminal is connected to a positive terminal of a first voltage source;
    and said fourth switching means wherein a first terminal is connected to the first input of the buffer amplifier and a second terminal is connected to the positive terminal of the first voltage source;

said first voltage source, having a positive and a negative terminal, wherein a negative terminal is connected to ground;

said buffer amplifier, having two inputs and an output, wherein a second input is connected to the output, and the output is further connected to an input of an integrator stage;

said integrator stage comprising:
an input resistor connected between the output of the buffer amplifier and a first input of an operational amplifier;
said operational amplifier having two inputs and an output, wherein a second input is connected to the positive terminal of the first voltage source and the output is connected to an input of a sample and hold stage, to a second terminal of a feedback capacitor and to a second terminal of a reset switching means;
said feedback capacitor wherein a first terminal of the feedback capacitor is connected to the first input of the operational amplifier; and
said reset switching means wherein a first terminal of the reset switching means is connected to the first input of the operational amplifier; and
said sample and hold stage generating a digital output signal of the circuit; wherein the circuit is configured for calibration of the pre-amplifier, the buffer amplifier and the integrator stage before each measurement.

13. The circuit of claim 12 wherein said pre-amplifier stage comprises a combination of a level shifter circuit and a gain stage.

14. The circuit of claim 13 wherein said gain stage has a high gain.

15. The circuit of claim 12 wherein the second amplifier stage is omitted.

16. The circuit of claim 12 wherein said sample and hold stage comprises:
a first sample and hold circuit comprising:
a seventh switching means, wherein a first terminal of the seventh switching means is connected to the output of the operational amplifier and a second terminal is connected to a first terminal of a third capacitor and to a first input of a comparator;
said third capacitor, wherein a second terminal of the third capacitor is connected to a first terminal of a first variable voltage source; and
said first variable voltage source, wherein a second terminal of the first variable voltage source is connected to ground;
a second sample and hold circuit comprising:
an eighth switching means, wherein a first terminal of the eighth switching means is connected to the output of the operational amplifier and a second terminal is connected to a first terminal of a fourth capacitor and to a second input of the comparator;
said fourth capacitor, wherein a second terminal of the fourth capacitor is connected to a first terminal of a second variable voltage source; and
said second variable voltage source, wherein a second terminal of the second variable voltage source is connected to ground; and
said comparator, wherein the output of the comparator is the output of the circuit for fast detection of a low voltage.

17. The circuit of claim 16 wherein two optional reset integrators can be attached to the sample and hold stage wherein a first of the reset integrator can be attached via a ninth switching means to the positive input of the comparator and a second of the reset integrator can be attached via a tenth switching means to the negative input of the comparator.

18. The circuit of claim 17 wherein the time span required between calibration of the circuit and generation of an output signal is far below 1 msec.

19. The circuit of claim 12, wherein for calibration the second switching means is closed and after the pre-amplifier is calibrated and settled the third and the fourth switching means are opened to calibrate the integrator stage, wherein the fifth switching means is opened and the sixth switching means is closed to generate a voltage stimulus for the integrator calibration and by this integrator calibration the gain of the integrator is known and the temperature coefficient of the input resistor of the integrator stage can be eliminated.

* * * * *